US012038388B2

United States Patent
Hong et al.

(10) Patent No.: US 12,038,388 B2
(45) Date of Patent: Jul. 16, 2024

(54) METHOD FOR EVALUATING DEFECT IN MONOCLINIC GALLIUM OXIDE

(71) Applicant: The Industry & Academic Cooperation in Chungnam National University (IAC), Daejeon (KR)

(72) Inventors: Soon-Ku Hong, Sejong-si (KR); Si Trong Ngo, Daejeon (KR); Quoc Vuong Nguyen, Daejeon (KR)

(73) Assignee: THE INDUSTRY & ACADEMIC COOPERATION IN CHUNGNAM NATIONAL UNIVERSITY (IAC), Daejeon (KR)

( * ) Notice: Subject to any disclaimer, the term of this patent is extended or adjusted under 35 U.S.C. 154(b) by 381 days.

(21) Appl. No.: 17/376,356

(22) Filed: Jul. 15, 2021

(65) Prior Publication Data

US 2022/0050062 A1 Feb. 17, 2022

(30) Foreign Application Priority Data

Aug. 11, 2020 (KR) ........................ 10-2020-0100775

(51) Int. Cl.
| | |
|---|---|
| *G01N 21/95* | (2006.01) |
| *G01B 11/30* | (2006.01) |
| *G01N 1/32* | (2006.01) |
| *G01N 21/956* | (2006.01) |
| *C30B 29/16* | (2006.01) |

(Continued)

(52) U.S. Cl.
CPC ......... *G01N 21/9505* (2013.01); *G01B 11/30* (2013.01); *G01N 1/32* (2013.01); *G01N 21/95607* (2013.01); *C30B 29/16* (2013.01); *C30B 33/08* (2013.01); *G01N 2021/8887* (2013.01)

(58) Field of Classification Search
CPC ........... G01N 21/9501; G01N 21/9505; G01N 21/95607
See application file for complete search history.

(56) References Cited

U.S. PATENT DOCUMENTS 5,406,367 A * 4/1995 Sopori ............... G01N 21/9501
356/30
5,766,976 A * 6/1998 Majima .................... G01N 1/32
216/84

(Continued)

OTHER PUBLICATIONS

Young Jun Joo et al., "Microstructure analyses of aluminum nitride (AlN) using transmission electron microscopy (TEM) and electron back-scattered diffraction (EBSD)", Journal of the Korean Crystal Growth and Crystal Technology, 2015, pp. 127-134, vol. 25, No. 4.

(Continued)

*Primary Examiner* — Tran M. Tran
(74) *Attorney, Agent, or Firm* — Paratus Law Group, PLLC

(57) ABSTRACT

Disclosed is a qualitative evaluation method of a volumetric defect density due to other grains having different crystal orientations from a single crystal matrix in a (001) monoclinic gallium oxide sample or a (010) monoclinic gallium oxide sample. The method includes the steps of: forming an etch pit by etching an observation plane of a single crystal; and selecting a quadrilateral etch pit formed by volumetric defects except for void defects.

5 Claims, 12 Drawing Sheets

(51) Int. Cl.
*C30B 33/08* (2006.01)
*G01N 21/88* (2006.01)

(56) References Cited

U.S. PATENT DOCUMENTS

| | | | | |
|---|---|---|---|---|
| 6,391,662 | B1* | 5/2002 | Mule'Stagno | C30B 15/206 |
| | | | | 252/79.3 |
| 6,638,357 | B2* | 10/2003 | Mule'Stagno | C30B 29/06 |
| | | | | 257/E21.321 |
| 6,803,240 | B1* | 10/2004 | Bedell | G01N 21/9501 |
| | | | | 438/689 |
| 7,718,446 | B2* | 5/2010 | Saito | G01N 21/9505 |
| | | | | 438/16 |
| 8,831,910 | B2* | 9/2014 | Shintani | H01L 22/24 |
| | | | | 438/17 |
| 9,245,749 | B2* | 1/2016 | Sasaki | H01L 21/02565 |
| 9,275,912 | B1* | 3/2016 | Jiang | H01L 22/24 |
| 9,349,915 | B2* | 5/2016 | Koshi | H01L 33/16 |
| 9,431,489 | B2* | 8/2016 | Koshi | C30B 29/16 |
| 9,831,274 | B2* | 11/2017 | Takahashi | G02F 1/1368 |
| 9,881,939 | B2* | 1/2018 | Takahashi | G01N 23/207 |
| 9,926,646 | B2* | 3/2018 | Watanabe | C30B 15/30 |
| 10,008,426 | B2* | 6/2018 | Nakai | G01N 1/32 |
| 10,119,920 | B2* | 11/2018 | Mizutani | G01N 21/21 |
| 10,184,903 | B2* | 1/2019 | Seo | G01N 21/9505 |
| 10,504,737 | B2* | 12/2019 | Liao | H01L 22/24 |
| 10,892,282 | B2* | 1/2021 | Takahashi | H01L 29/7869 |
| 10,928,329 | B2* | 2/2021 | Shafiei | G01N 21/9501 |
| 10,983,158 | B2* | 4/2021 | Saito | G01N 21/9505 |
| 11,047,807 | B2* | 6/2021 | Buzaglo | G06N 3/02 |
| 11,193,895 | B2* | 12/2021 | Ohira | G01N 21/9501 |
| 11,410,292 | B2* | 8/2022 | Shankar | G06V 10/50 |
| 11,415,518 | B2* | 8/2022 | Anderson | H01L 29/2003 |
| 11,652,110 | B2* | 5/2023 | Takahashi | H01L 22/12 |
| | | | | 250/307 |
| 11,726,126 | B2* | 8/2023 | Marivoet | G01N 21/9505 |
| | | | | 250/341.4 |
| 11,733,177 | B2 | 8/2023 | Hong et al. | |
| 2005/0231733 | A1* | 10/2005 | Pfaff | G01B 11/2441 |
| | | | | 257/E21.53 |
| 2012/0016630 | A1* | 1/2012 | Shintani | G01B 11/22 |
| | | | | 702/166 |
| 2019/0279890 | A1* | 9/2019 | Mori | H01L 29/16 |
| 2022/0127713 | A1* | 4/2022 | Obonai | H01L 29/78648 |
| 2022/0260504 | A1* | 8/2022 | Funaya | H01L 24/85 |
| 2022/0291145 | A1* | 9/2022 | Wei | G01N 21/9501 |
| 2022/0327682 | A1* | 10/2022 | Tsao | G06F 18/00 |
| 2022/0333269 | A1* | 10/2022 | Wei | C30B 29/06 |
| 2022/0410305 | A1* | 12/2022 | Genda | G01N 21/6489 |
| 2023/0125000 | A1* | 4/2023 | Tomii | H01L 22/12 |
| | | | | 356/237.4 |
| 2023/0204520 | A1* | 6/2023 | Liang | G01N 21/8851 |
| | | | | 356/237.5 |

OTHER PUBLICATIONS

Kenji Hanada et al., "Origins of etch pits in $\beta$-Ga$_2$O$_3$(010) single crystals", Japanese Journal of Applied Physics, 2016, pp. 1-10, No. 55, 1202BG.

F. Secco D' Aragona, "Dislocation Etch for (100) Planes in Silicon", Journal of The Electrochemical Society, Jul. 1972, pp. 948-951, vol. 119, No. 7.

* cited by examiner

METHOD FOR EVALUATING DEFECT IN MONOCLINIC GALLIUM OXIDE

CROSS-REFERENCE TO PRIOR APPLICATION

This application claims priority to Korean Patent Application No. 10-2020-0100775 filed on Aug. 11, 2020, which is hereby incorporated by reference in its entirety.

BACKGROUND

The present invention relates to a method for qualitatively and quantitatively evaluating a volumetric defect density in a large-area monoclinic gallium oxide sample by a standardized method even by unskilled persons without using expensive and complicated equipment.

Power semiconductors are semiconductors that perform control processing such as the direct current/alternating current (DC/AC) conversion, voltage, change in frequency for electrical energy utilization, and are key components that determine the operational status of an electrically driven product and performance. Power semiconductors are widely used in electronic devices for households, elevators, subways, and industrial machinery, and there is a deep connection with a growth of new industries such as smart grids, electric vehicles, and the Internet of Things (IoT), in which new demands are growing rapidly.

Conventional power semiconductor devices have been employed on basis of silicon (Si), however, a limitation of performance development in contrast to technology development has been reached due to intrinsic limitations of physical properties. Gallium nitride (GaN, 3.4 eV) having wide bandgap (WB) and silicon carbide (4H—SiC, 3.3 eV) are suggested as alternatives. In particular, gallium nitride has excellent physical properties compared to other semiconductor materials such as high threshold voltage, high electron mobility, and high electron saturation rate, and is widely used for high-frequency, high-power, and high-temperature semiconductor devices. However, as gallium nitride may not be applied to a low-cost large-area substrate, gallium nitride power semiconductor devices that are currently and commercially available use a heteroepitaxial thin film grown on a silicon substrate. There is a problem in that the defect density is high, and the threshold voltage is limited to 600 to 900 V. Silicon carbide is commercially available in 6-inch single crystal substrates, however, this suffers from a number of drawbacks, including: a high cost of a substrate due to vapor growth at a high temperature of about 2800° C., an intricate fabrication due to a high hardness results in a complicated fabrication process and a high cost.

Recently, gallium oxide ($Ga_2O_3$) having high efficiency in terms of power performance compared to gallium nitride and silicon carbide, is highly regarded as a material for the next-generation power semiconductor device. Gallium oxide exhibits a wider UWB (ultra-wide bandgap, 4.9-5.1 eV) than gallium nitride, and exhibits a breakdown voltage characteristic at the level of gallium nitride or silicon carbide even—with the—film—thickness of ⅓ of that of gallium nitride or silicon carbide. In addition, since the single crystal growth is possible by using a melt growth method and doping at room temperature, it results in a reduction in manufacturing cost, thus the cost of fabrication is economical, as the cost may reduce to ⅓ or ⅕ of the price, compared to employing gallium nitride or silicon carbide. Further, manufacturing a large-area substrate is possible, which makes gallium oxide an ideal material for power semiconductors. In fact, gallium oxide substrates are expected to be manufactured at a low cost similar to that of sapphire substrates in the future. In particular, as gallium oxide has superior physical properties compared to gallium nitride and silicon carbide, it is expected to have high utility in applications in the areas requiring high power applications in a 100 kW-class which has a breakdown voltage of 2 kV. A commercial gallium oxide single crystal substrate has a monoclinic structure comprising: (100), (−201), (010) and (001) substrates, wherein the (100) substrate is not in use due to a slow epi growth rate, and while (−201) substrate may be supplied as a commercial substrate to a size of 2 inches in diameter, and degradation in device performance is expected since there is a report on a possibility of induced twin crystal defects. The (010) substrate is supplied in pieces with a size of 1 cm by 1.5 cm, which limits a mass production of devices. In contrast, the (001) substrate may be supplied with a size of 4 inches in diameter, and there is a possibility of the presence of twin defects is perceived to be small compared to (−201) substrate so that the (001) substrate takes a large portion of the device production.

Unlike conventional amorphous silicon, the material of single crystal may cause crystal defects such as misalignment due to multiplicity, and the vibrations of structure. The crystal defects may be classified into dimensions. That is, point defects (zero-dimensional defects) involve foreign atoms replacing some of the atoms, producing vacancies, or shifting to the interstices. Line defects (one-dimensional defects) are lines of atoms in the solid arranged anomalously, which results in missing of atoms and irregularity in spacing along the line typically called dislocations. The dislocations include edge dislocations and screw dislocations. A twin defect is one of the planar defects (two-dimensional defects), in which an alignment of crystals is symmetrically arranged about twin planes, and the planar defects include stacking faults and a grain boundaries. Volumetric defects (three-dimensional defects) are defects, in which defects having volumes like precipitates and voids in the crystals. Not only affecting the mechanical strength, but also the crystal defects cause to degraded properties of semiconductors such as reducing the mobility of carriers, increasing the leakage-current, and reducing the threshold voltage. The greater the dimension of the defect, the greater the impact on the characteristics of the device, and the more severe the defects that the volumetric defects may significantly degrade the characteristics in the device as compared to other crystal defects, including planar defects, also the higher the degree of integration, such as very-large-scale integration (VLSI), Ultra-large-scale integrated circuit (ULSI), the characteristics of the device may even more affected. Therefore, analyzing the type and degree of generation (defect density) of defects according to the method of growing single crystals or single crystalline thin films is very important for evaluating the effectiveness of the crystal growth method and optimizing the crystal growth conditions to develop high-quality crystal growth technique.

As a method for measuring the defect density of the single crystals or the single crystalline thin films, there are various methods, such as cathode emission method, time-resolved photoluminescence method, etching method, X-ray topography, and transmission electron microscopy (TEM), and atomic force microscopy (AFM) observations. Among these methods, the etching method may allow the unskilled persons to measure defects of a single crystal or a single crystalline thin film having a large area by standardized method, by observing etch pits formed by etching with an optical microscope. Thus, Japanese Patent Publication No.

4758492 discloses a method of measuring the defect density for each type of defect by measuring the maximum depth, average depth, depth curvature, and determining the type of the defect associated with each etch pit therefrom. However, the defect density calculated from etch pits in the previous studies is limited to dislocations which are one-dimensional defects. The defect density for dislocations is calculated from the sum of the lengths of dislocation lines present in the total volume of the sample under consideration and may be determined as the sum of lengths of dislocation lines/volume. However, when the dislocation line moves vertically upward from the bottom (which is called threading dislocation), the length of the dislocation line may equal to the height of the sample and offsets each other, so that the dislocation density is determined by the number of etch pits generated at the dislocation per unit area and the unit is $cm^{-2}$. Kasu et al (Japanese Journal of Applied Physics 56, 091101, 2017) calculates the defect density contained in the monoclinic gallium oxide from the etch pit and evaluates the correlation with the electrical properties but is also limited to dislocations. Lebedev et al (Physica B 404, 2009, p4758) stated that various crystal defects at the boundaries of twin defects may increase significantly. Conventionally, for twin defects, a method of analyzing defect density by X-ray topography has been proposed, but not only expensive equipment has to be used, but also it is common to use a synchrotron which is difficult to be equipped in general offices or laboratories, and there is a problem that analysis is possible only by skilled experts. When analyzing by the TEM, the scope of analysis is limited to a very small region, and there is a problem in that the analysis is limitedly available when the twin defect density is high. Accordingly, the inventors of the present invention have developed a method of measuring the defect density of twin defects by a method of etch pit generation conveniently, and have been registered in Korean Patent Registration No. 10-2012809. However, there has not yet been reported a method for conveniently detecting volumetric defects, which are three-dimensional defects, and further, evaluating the defect density.

SUMMARY

Therefore, the present invention has been made in view of the above problems, and it is an object of the present invention to provide a method for evaluating a volumetric defect in a monoclinic gallium oxide sample, by a standardized and simple method without using expensive equipment.

In addition, another object of the present invention is to provide a method for quantitatively evaluating the volumetric defect density of a monoclinic gallium oxide sample to a large-area sample by unskilled persons.

To accomplish the above objects, according to one aspect of the present invention, there is provided a method for evaluating volumetric defects in a monoclinic gallium oxide sample, comprising the steps of: (A) etching an observation surface of a monoclinic crystal to form an etch pit; and (B) selecting a quadrilateral etch pit formed by the volumetric defects.

The etching may be produced by treating the sample with an etchant, such as strong acids or strong bases at a high temperature. Examples of etchants may include, but are not limited to, phosphoric acid, hydrochloric acid, and KOH. The etch pits represent different aspects depending on the defects with grooves produced from a faster etching of the defects in the crystal. Until now, etch pits have been studied focusing on dislocations which are line defects, and the inventors have reported etch pits for twin defects which are planar defects in Korean Patent Registration No. 10-2012809. However, there has not yet been an attempt to quantitatively evaluate etch pit by volumetric defects or the volumetric defects using the same.

A method of growing homoepitaxy from a substrate serving as a seed for a monoclinic gallium oxide is mainly used. Homoepitaxy growth forms an epi-layer that is the same as the crystal orientation of the substrate. For the epi-layer growth of gallium oxide, a monoclinic gallium oxide single crystal substrate including (010), (100), (001), and (-201) substrates. Among these substrates, since the (100) substrate has a very slow growth rate of epi-layer, the practicality as a substrate for the single crystal growth is low. Currently, the (-201) substrate is commercially available as a 2-inch substrate, and the growth rate of epi-layer is also pertinent, but there is a problem that twin defects may be produced. The (010) substrates are not slow in the growth rate of epi-layers and the report on the twin defects has not been a significant issue, and are sold as 10 mm by 15 mm segmented substrates, and are often used for the fabrication device and performance demonstrations in the research institutes and universities. The (001) substrate is commercially available as a 4-inch substrate, and is currently most effective for the growth of the epitaxial layer and since the epitaxial thin film growth rate is not particularly low. Accordingly, in the present invention, an etch pit was formed using a (010) substrate and a (001) substrate, which are the most effective for the growth of epi-layer, and confirmed the volumetric defects from the etch pit. The most primary etch pits in the gallium oxide epi-layer grown on a (010) substrate and a (001) substrate are quadrilateral etch pits and can be confirmed that the etch pits were formed by defects caused by other grains having different crystal orientations from the single crystal matrix.

The quadrilateral etch pit was different in specific shapes according to the crystal orientations of the single crystal sample. That is, in the case where the monoclinic gallium oxide sample is a (001) sample, the quadrilateral etch pit, in specific, is a rectangle having an aspect ratio greater than 1, which is depicted a rod-shape. At this point, the major axis direction of the rectangle is in the direction of (010). In the case where the monoclinic gallium oxide sample was a (010) sample, the quadrilateral etch pit depicted a parallelogram shape with no major difference in length of four sides.

Thus, the present invention, by merely forming and observing an etch pit in a monoclinic gallium oxide, may confirm the defects being present to a certain degree qualitatively in a simple manner. The observation of the etch pit may be carried out using an electron microscope such as TEM or SEM, but using an optical microscope allows evaluating the volumetric defects simply for a large-area sample in a short time. Accordingly, the present invention may be used effectively for development of high-quality epi-growth technology using commercial substrates.

The present invention further relates to a method for qualitatively evaluating a volumetric defect density of the monoclinic gallium oxide sample. The method for evaluating the volumetric defect density according to the present invention comprises the steps of: (A) etching an observation surface of a single crystal to form a etch pit; (B) selecting a quadrilateral etch pit formed by volumetric defects; and (C) evaluating a density of volumetric defects from the shape of the etch pit obtained from the volumetric defects by the following equation.

$$\text{Volumetric defect density} = \Sigma k a_i b_i / \text{area of sample},$$

(wherein $0<k\leq1$, $a_i$ is the width of the etch pit by the i-th volumetric defect; $b_i$ is the height of the etching pit by i-th volumetric defect)

As described above, the volumetric defect is a grain having a crystal orientation different from that of the single crystal matrix, and additional defects are contained in the grains. The defects additionally contained in the grains include other conventionally known defects such as stacking faults and includes regions having different degrees of rotation in crystal orientations of the single crystal matrix.

In the above equation, the width of etch pit refers to the length of any one side of a quadrilateral etch pit, and the height of the etch pit refers to the average vertical distance from one side defining the width to the opposite side. For example, in the case where the sample is a (001) sample, the etch pit is rectangular, therefore the width may be a length of a minor axis and the height may be the length of the major axis, or the width may be the length of major axis and the height may be the length of the minor axis. In the case where the sample is a sample (010), the etch pit is a parallelogram, therefore the width is the length of one side of the parallelogram and the height is the height of the parallelogram.

k refers to the depth of the volumetric defect, where $0<k\leq1$, and specifically, the value thereof varies depending on the crystal orientation of the monoclinic gallium oxide sample and the thickness of a sample.

When the monoclinic gallium oxide sample is a (001) sample, the value of k may be expressed as ½×(depth of defect/thickness of sample) and has a value of $0<k\leq½$. Since the defect typically propagates from near the interface between the seed substrate layer and the epitaxial layer during the epitaxial growth, the thicker the thickness of the sample (depth of defect/thickness of sample) converges to 1. According to the result of the observation, the defect started within approximately 75 nm from the substrate. Therefore, if the thickness of the sample is equal to or greater than 1.5 µm, the volumetric defect density may be determined from the following equation, ½×$\Sigma a_i b_i$/area of the sample, with an error range within 5%. Depending on the manufacturing method, equipment, and conditions, it is clear that there may be a difference at the time of occurrence of defects, therefore the reference thickness may also be affected. In this case, it will be readily apparent to a person skilled in the art to measure the occurrence timing of a defect for each equipment and manufacturing method by confirming the cross-sectional image of the etch pit as the following examples and estimate the value of k therefrom.

When the single crystal monoclinic gallium oxide sample is a (010) sample, then k is $0<k\leq1$. The experimental observation result showed that all the volumetric defects in the (010) single crystal propagated from the interface between the seed substrate and the epi-layer, and the thickness of the sample was equivalent to the depth of the volumetric defects. Thus, k=1, from which the volumetric defect density is $\Sigma a_i b_i$/area of sample.

In the evaluation of the volumetric defect density by the equation above, it is possible to compare quantitatively between the monoclinic gallium oxide sample having the same crystal plane, as well as the monoclinic gallium oxide having different crystal planes to each other. This suggests that it is possible to compare the quality between monoclinic gallium oxide samples having different crystal planes by a simple method without undergoing a complicated process of evaluating the quality of the single crystal by evaluating the characteristics of the device after fabricating the device from monoclinic gallium oxide.

BRIEF DESCRIPTION OF THE DRAWINGS

For more complete understanding of the present invention and its advantages, reference is now made to the following description taken in conjunction with the accompanying drawings, in which like reference numerals represent like parts.

DETAILED DESCRIPTION

Figure 1:
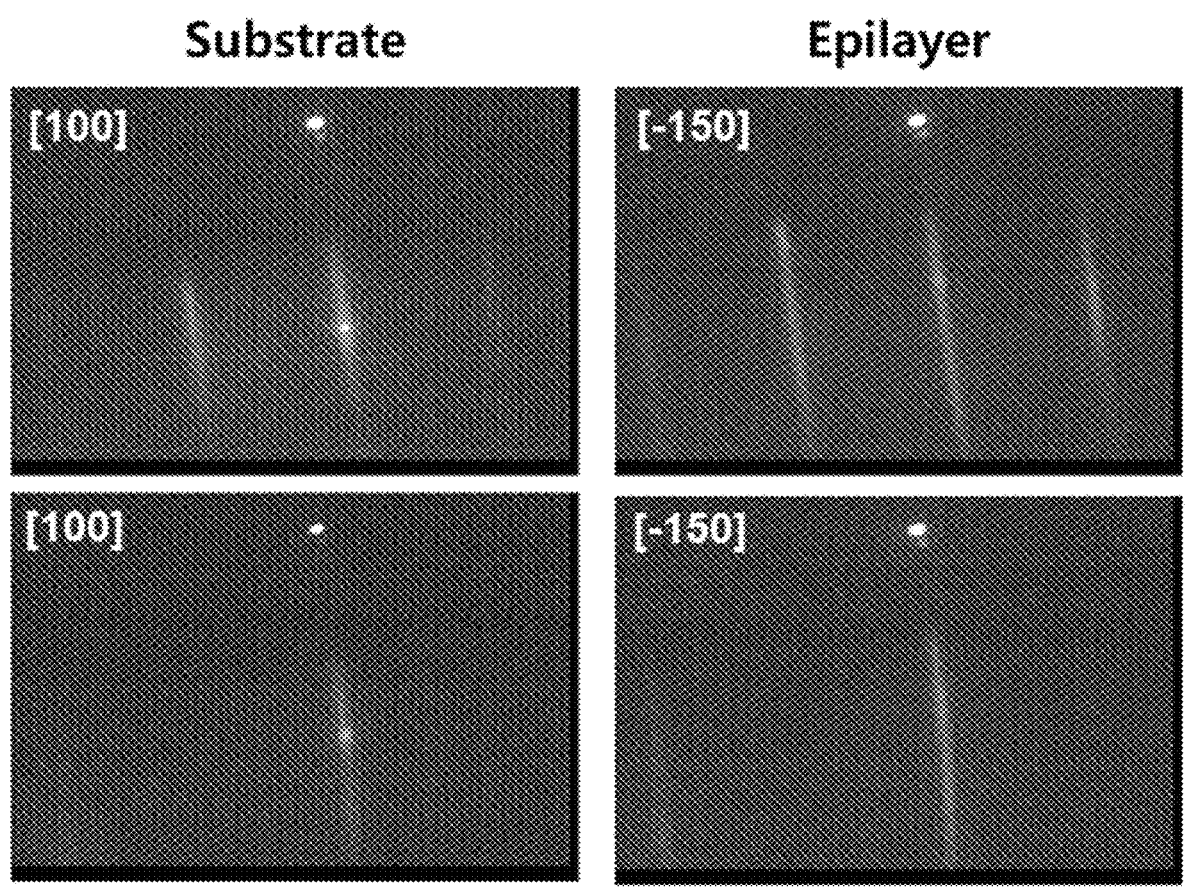
FIG. 1 is an image showing a Reflection High Energy Electron Diffraction (RHEED) pattern of a gallium oxide epi-layer according to Preparation Example 1.

To fully understand the present invention, the operational advantages of the present invention, and the objects achieved by the embodiments of the present invention, reference should be made to the accompanying drawings and the contents described in the accompanying drawings, which illustrate preferred embodiments of the present invention.

EXAMPLES

Example 1: Homoepitaxial Growth of Gallium Oxide

For the epi-layer growth of gallium oxide, single crystal substrates include (010), (100), (001), and (−201) substrates. Among these substrates, since the (100) substrate has a very slow growth rate of epi-layer, the practicality as a substrate for the single crystal growth is low, and currently, a (−201) substrate is commercially available as a 2-inch substrate, and the growth rate of epi-layer is also pertinent, but there is a problem that the frequency of twin defects may be high. The gallium oxide epi-layer was then grown using a (001) substrate which commercialized to up to 4 inches which expected to be most widely used in the future for gallium oxide epitaxial growth for device applications, and the (010) substrate which is currently the most commonly used for device fabrication demonstrations, although the size of commercial substrates is limited to 10 mm×15 mm segmented substrates, and defects in each substrate were analyzed.

Preparation Example 1: (001) Homoepitaxial Growth on Gallium Oxide Substrate

The commercial gallium oxide (001) substrate was cleaned by ultrasonic stirring for 10 minutes sequentially using acetone, methanol, and deionized water (DI water). The cleaned substrate was chemically cleaned with a 1:1:4 mixtures in a volume ratio of Di water, 30% hydrogen peroxide, and 96% sulfuric acid for 5 minutes and then further cleaned with DI water and dried using nitrogen gas. The dried substrate was introduced into a Plasma Assisted Molecular Beam Epitaxy (PAMBE) growth chamber and thermally cleaned at 850° C. for 30 minutes using oxygen radicals generated with plasma excited by an RF power of 300 W and an oxygen gas flow rate of 2 sccm to prepare a substrate.

A plasma-assisted molecular beam epitaxy growth chamber equipped with a substrate, elemental gallium (Ga) having a purity of 7 N was supplied through a Sumo Effusion cell, (Veeco, USA), and oxygen was flowed through a plasma cell (SVAT, USA) to generate oxygen radicals by plasma, whereby a gallium oxide thin film was grown by the method of PAMBE. The growth chamber pressure before gas introduction was about $2 \times 10^{-9}$ Torr, the pressure during growth was $2 \times 10^{-5}$ Torr to $4 \times 10^{-5}$ Torr, and the conditions for thin film growth are as shown in Table 1.

TABLE 1

| Epitaxial growth temperature (° C.) | 850 |
| Oxygen plasma (W-sccm) | 300-2 |
| Ga cell temperature (° C.) | 600 |
| Epitaxial growth time (hr) | 4 |

Preparation Example 2: (010) Homoepitaxial Growth on Gallium Oxide Substrate

A monoclinic gallium oxide was homoepitaxially grown on a (010) gallium oxide substrate using the same method of Preparation Example 1, except that the (010) substrate was used and the epi-growth temperature was set to 800° C.

Example 2: Confirming Growth of Gallium Oxide Epi-Layer

Before evaluating crystal defects, the crystal structure of the thin film grown in Example 1 was analyzed by Reflection High Energy Electron Diffraction (RHEED) and confirmed that the gallium oxide epi-layer was grown first. RHEED was analyzed under conditions of an electron energy voltage of 18 kV and a beam current of 39 µA.

Figure 2:
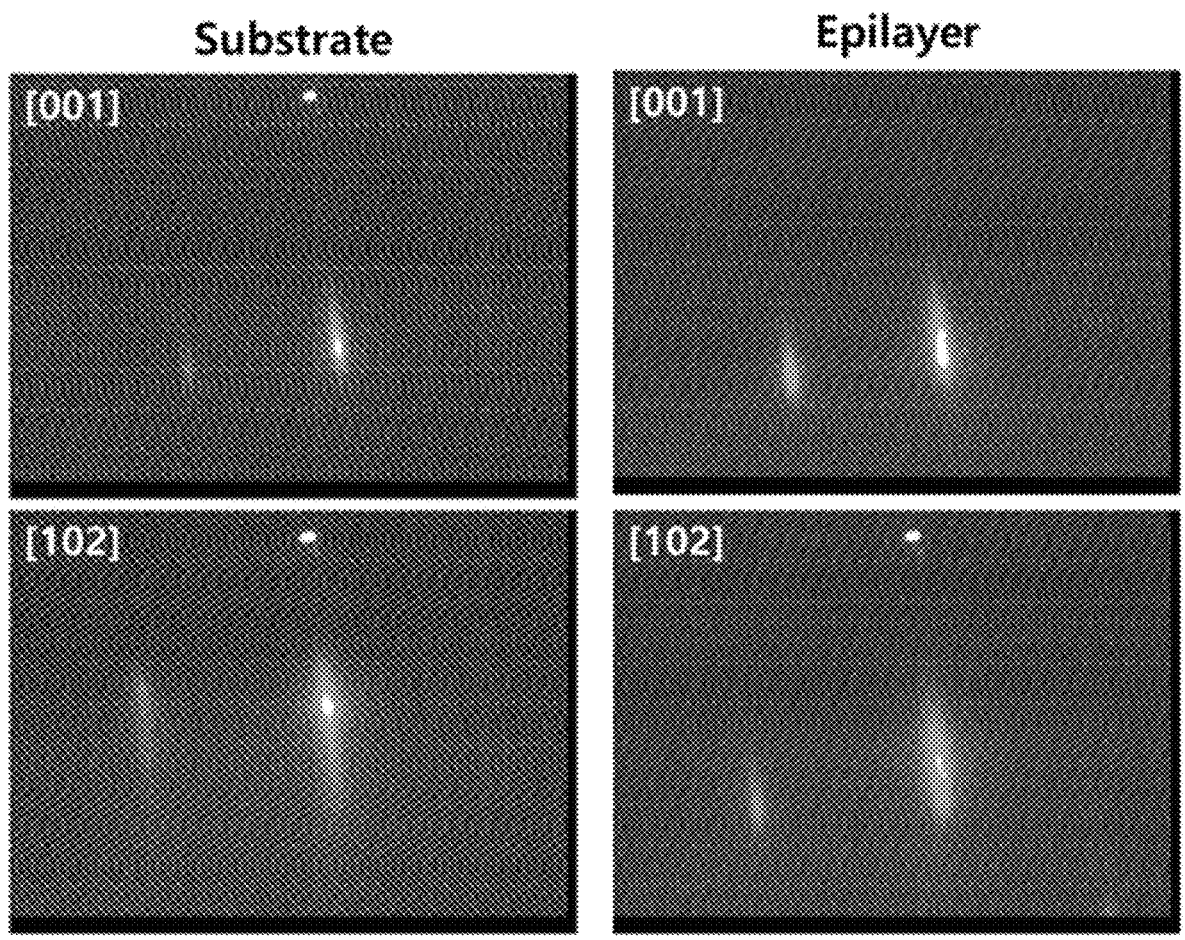
FIG. 2 is an image showing an RHEED pattern of a gallium oxide epi-layer according to Preparation Example 2.

FIG. 1 and FIG. 2 are images showing RHEED patterns of gallium oxide layer grown on a (001) substrate and a (010) substrate by Preparation Example 1 and 2, respectively. The gallium oxide layer grown in FIG. 1 and FIG. 2 exhibits the same RHEED pattern as of the substrate, respectively, and confirmed that a monoclinic gallium oxide epi-layer has grown on the substrate.

Example 3: Etch Pit Analysis

The gallium oxide epi-layer prepared in Example 1 was etched at 140° C. with 85% phosphoric acid for 2 minutes, and the etched surface was observed with an optical microscope and SEM. Optical microscope observation was carried out applying 1000× using the Nikon Eclipse LV100ND, and SEM observation used the a focused ion beam (FIB) from the FEI Helios NanoLab system. Hereinafter, an etch pit of gallium oxide epi-layer produced in Preparation Examples 1 and 2 is analyzed.

Preparation Example 1

Figure 3:
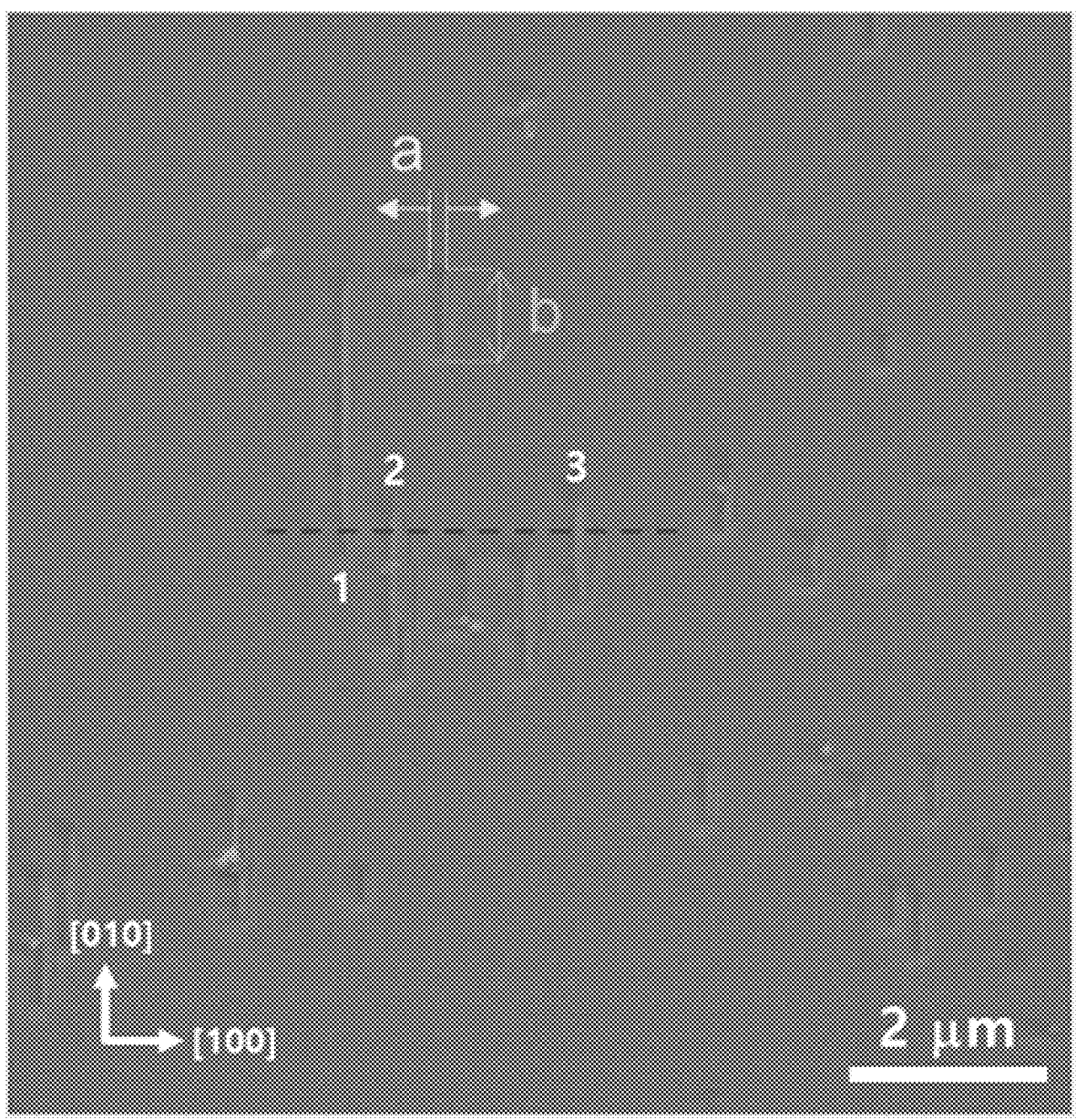
FIG. 3 is a SEM image showing an etch pit of a (001) gallium oxide epi-layer.

FIG. 3 is a planar SEM image showing an etch pit of a (001) gallium oxide epi-layer grown on the (001) substrate of Preparation Example 1. The most primary etch pit in FIG. 3 is a rod-shaped etch pit having a major axis in the [010] direction, and the rod-shaped minor axis length (a) was approximately 200 nm and the major axis direction length (b) was approximately several hundred nanometers to several micrometers. Hereinafter, the length in the minor axis direction referred to as width, and the length in the major axis direction is referred to as height.

Figure 4:
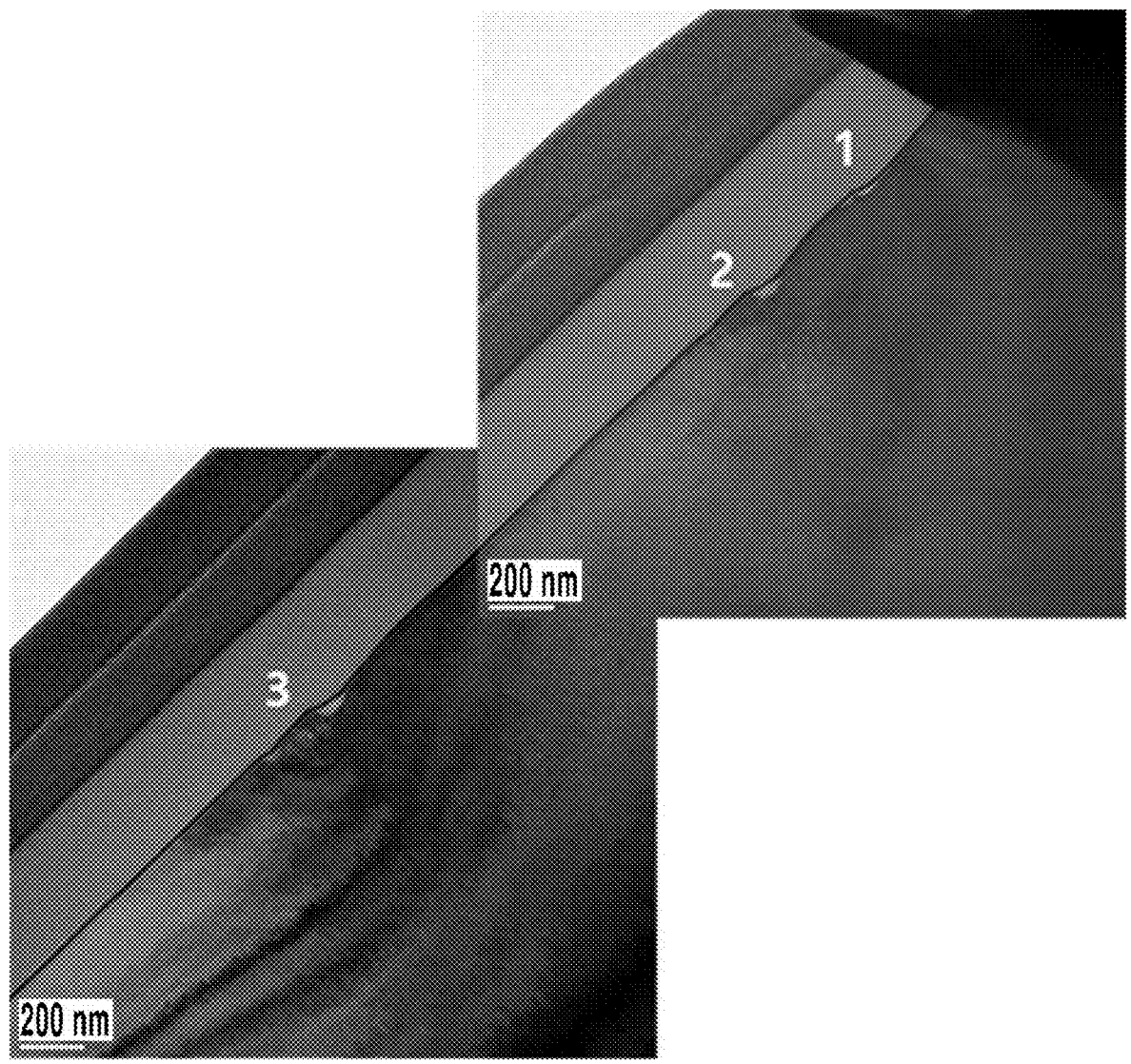
FIG. 4 is a TEM image showing a cross-section of an etch pit formed on a (001) gallium oxide epi-layer.

A TEM image of a cross-section including the etch pit was observed to identify the correlation between an etch pit and a defect. FIG. 4 is a low magnification bright-field TEM image of a TEM cross-sectional specimen fabricated by a FIB along the red dotted line of FIG. 3, and the numerals on the image correspond to the numerals indicated for the etch pit of FIG. 3. The presence of defect under each etch pit was confirmed.

Figure 5:
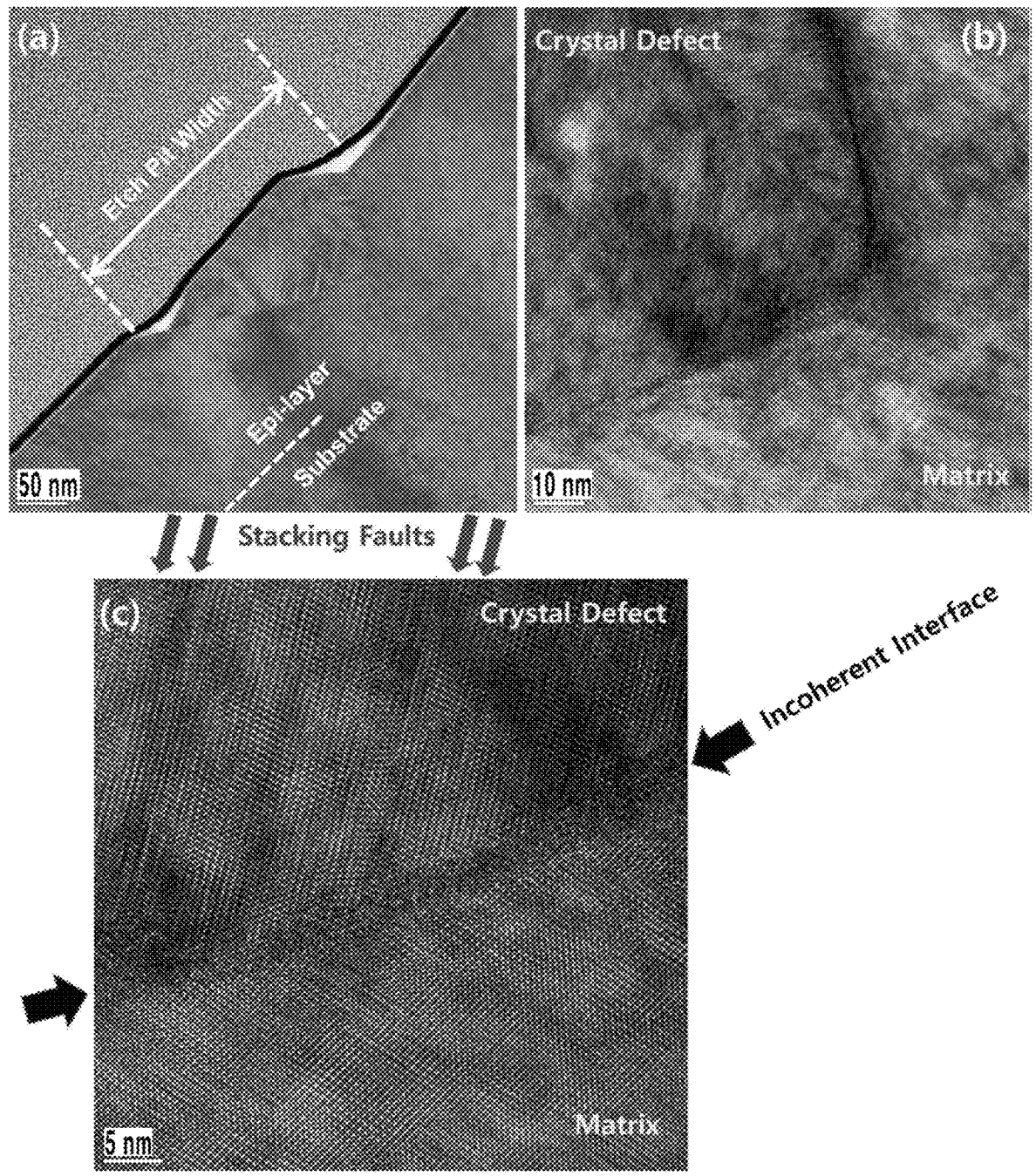
FIG. 5 is a high magnification cross-sectional TEM image for analyzing origin of an etch pit formed on a (001) gallium oxide epi-layer.

FIG. 5 is a high magnification bright-field TEM image of the third etch pits, which is identified that a defect is present under the etch pit in FIG. 5(a), and that the etch pit width reflects the width of the defect. In addition, the defect starts on tens of nanometers above the interface between the substrate and the epi-layer and propagate to the surface, and the width of the defects gradually increases as the substrate grows. FIG. 5(b) is a further magnified image of FIG. 5(a) showing that an incoherent interface is formed at the interface between the epi-layer and the defect and that there is an additional incoherent interface within the defect. Further, it can be identified from the TEM image FIG. 5(c) obtained by further magnifying the image that a plurality of stacking faults are produced inside the crystal defect due to the incoherent interface.

Figure 6:
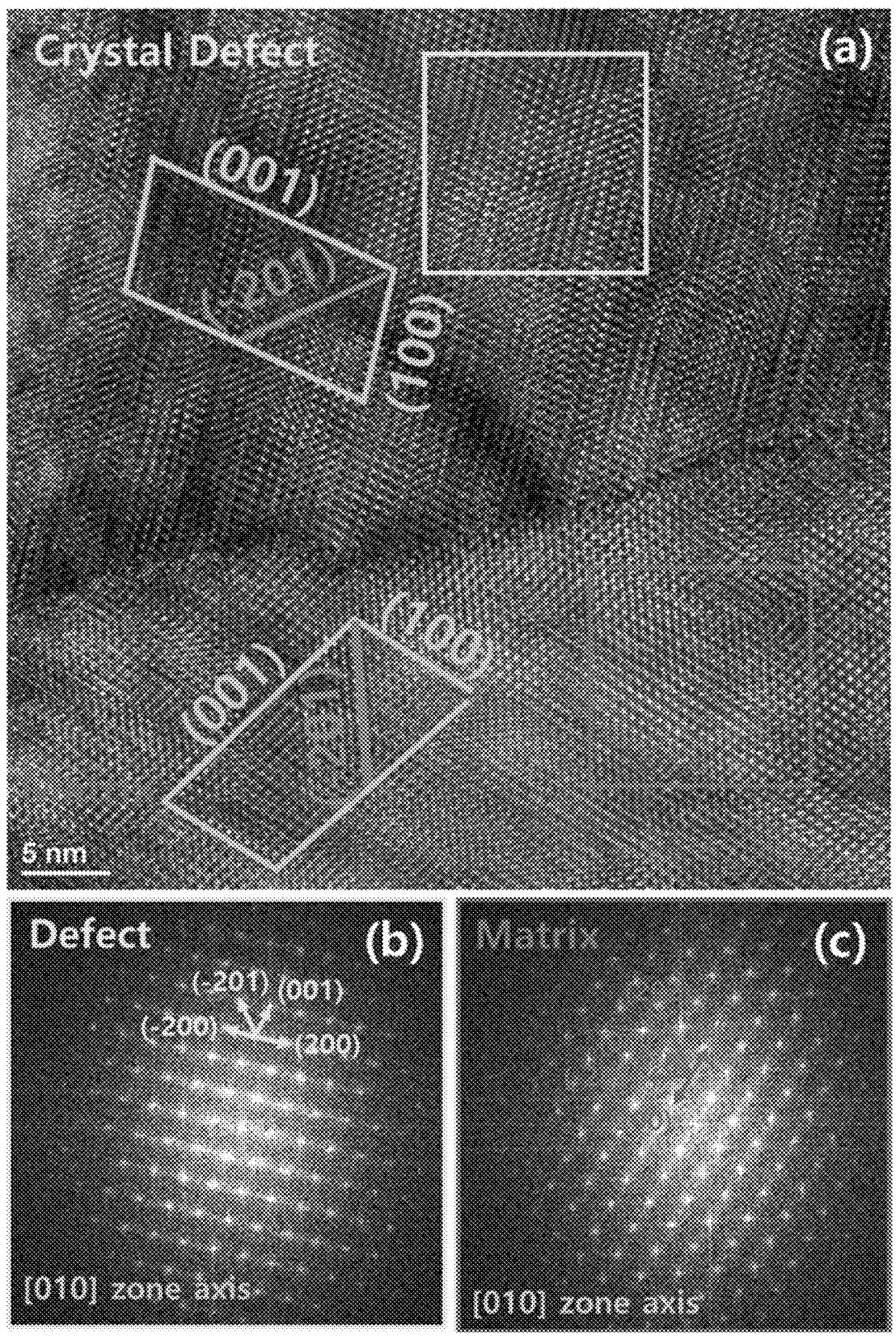
FIG. 6 is a high resolution TEM image and TEM diffraction patterns of a matrix and defect regions of a (001) gallium oxide epi-layer.

In order to clarify the cause of the defect, the defect region is observed with a high-resolution TEM, and the result is shown in FIG. 6. FIG. 6(b) and FIG. 6(c) are images showing a TEM diffraction pattern of a defect region and a matrix region represented by yellow and green quadrangles in the TEM image of (a), respectively, and the difference in the crystal orientations of the defect region and the matrix region can be seen clearly. The crystal orientations of the defect region and the matrix region were illustrated in FIG. 6(a), from which it may be seen that the defect regions are rotated with respect to the normal matrix region.

Overall, a rod-shaped etch pit, which is the primary etch pit is mainly caused by growth in which the crystal orientation of the matrix region is rotated. Rotation of the crystal orientation results in an incoherent interface in the matrix region and the defect region, which causes additional defects, such as rotational orientation or stacking faults in the defect region. This is in contrast to a twin defect, in which the crystal orientation is symmetrical, and the twin defect merely includes additional defect, and only the twin boundary is regarded as a defect and classified as a plane defect called a twin boundary defect (usually referred to as twin defect). The defects identified in the present embodiment are not the twin defect that classified into the planar defect, does not have a symmetric plane such as twinning, have a specific asymmetric rotational direction relationship, and include a plurality of additional defect, so that when compared with twin defects, and it is predicted that the effect of degrades in a device is expected to be significant. Therefore, it is reasonable to consider defect density in terms of volumetric defect rather than considering such defect as a planar defect. There is no such complex volumetric defect in a gallium oxide epi-layer has been reported.

Further, the defect density of the observed volumetric defect was calculated from the etch pit. The calculation of defect density using a conventional etch pit was limited to dislocations, and the inventors have registered a method for calculating defect density from the etch pit for a twin defect which is a planar defect, as in Korean Patent Registration No. 10-2012809. However, the etch pit has not been reported in the volumetric defect, and naturally, calculation of defect density has not been attempted.

Figure 7:
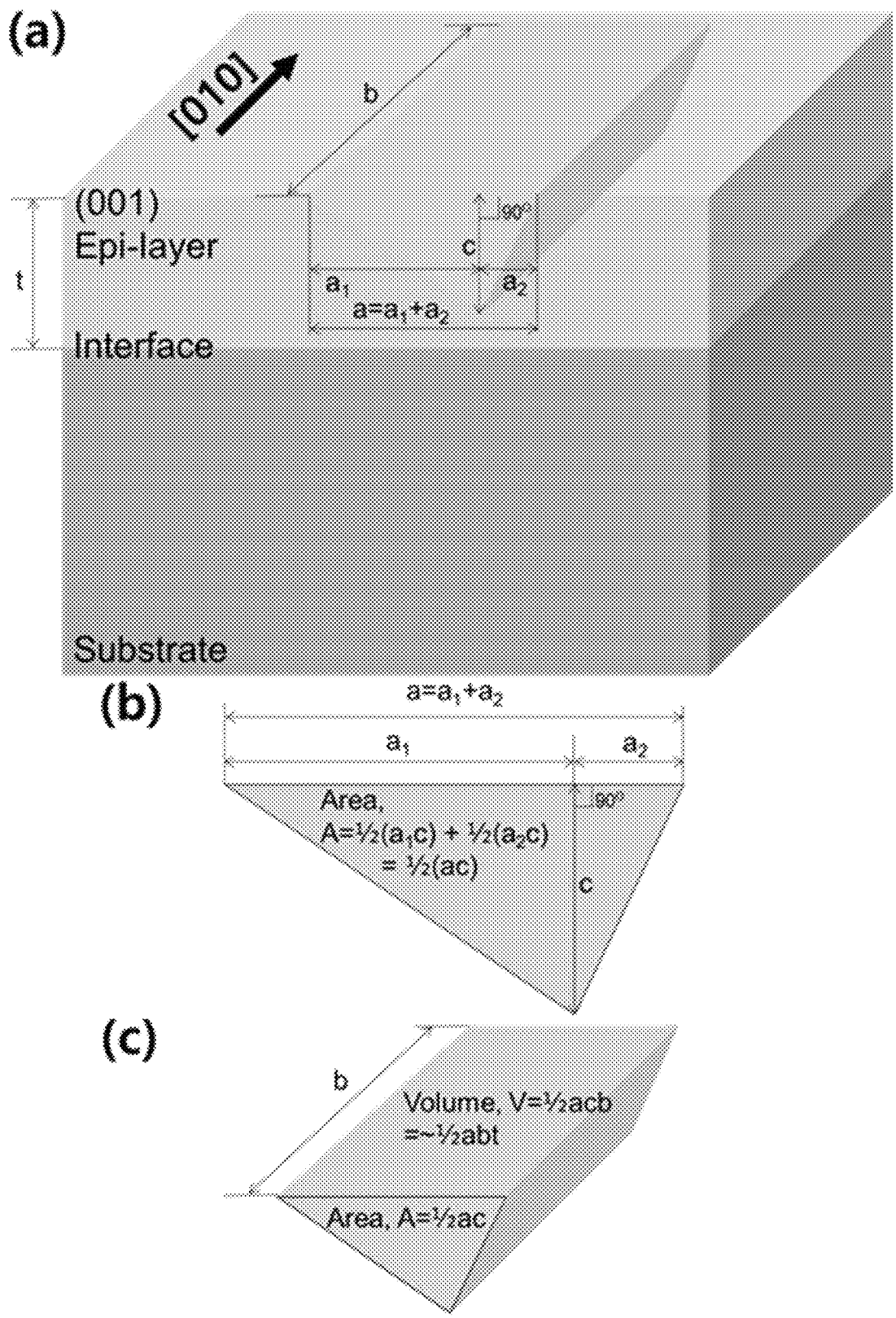
FIG. 7 is a schematic diagram showing an etch pit derived from a volumetric defect in a (001) gallium oxide epi-layer.

FIG. 7 is a volumetric defect and a schematic diagram for calculating the defect density of identified defects in the present embodiment. After identifying a TEM cross-section of various samples of a rod-shaped etch pit, a defect started in the middle of the epi-layer showed a triangular prism shape whose width gradually increases as the epi-layer grows. Accordingly, the volume for one of the volumetric defects may be determined from the following equation: ½×abc, wherein a is the width of the etch pit, b is the height of the etching pit and c is the depth of the volumetric defect. Since the depth of volumetric defect cannot be greater than the thickness of the epi-layer and expressed as $0 < c \leq z$, where z is the thickness of the epi-layer. Therefore, the volume of the volumetric defects may be determined from the following equation: kabz, where $0 < k \leq ½$.

Typically, the defect of the epitaxial layer grown by homoepitaxy is caused by a defect of a substrate, so that the defect is started near the interface between the substrate and the epitaxial layer. Therefore, when the thickness of the epitaxial layer is large, the thickness is converged from c to z, and thus k converges to ½.

Thus, the total volume V, where V=xyz, the density of volumetric defect may be determined from the following equation:

$$\text{Volumetric defect density} = \Delta ka_ib_ic/xyz = \Sigma ka_ib_iz/xyz = \Sigma ka_ib_i/xy = \Sigma ka_ib_i/\text{area of sample}$$

wherein $a_i$ is the width of the etch pit by the i-th volumetric defect; $b_i$ is the height of the etching pit by i-th volumetric defect, where $0 < k \leq ½$.

As the thickness of the epitaxially grown single crystal sample increases, k converges to ½, so that the volumetric defect density also converges to ($½ \times \Sigma a_ib_i$/area of sample).

Preparation Example 2

Figure 8:
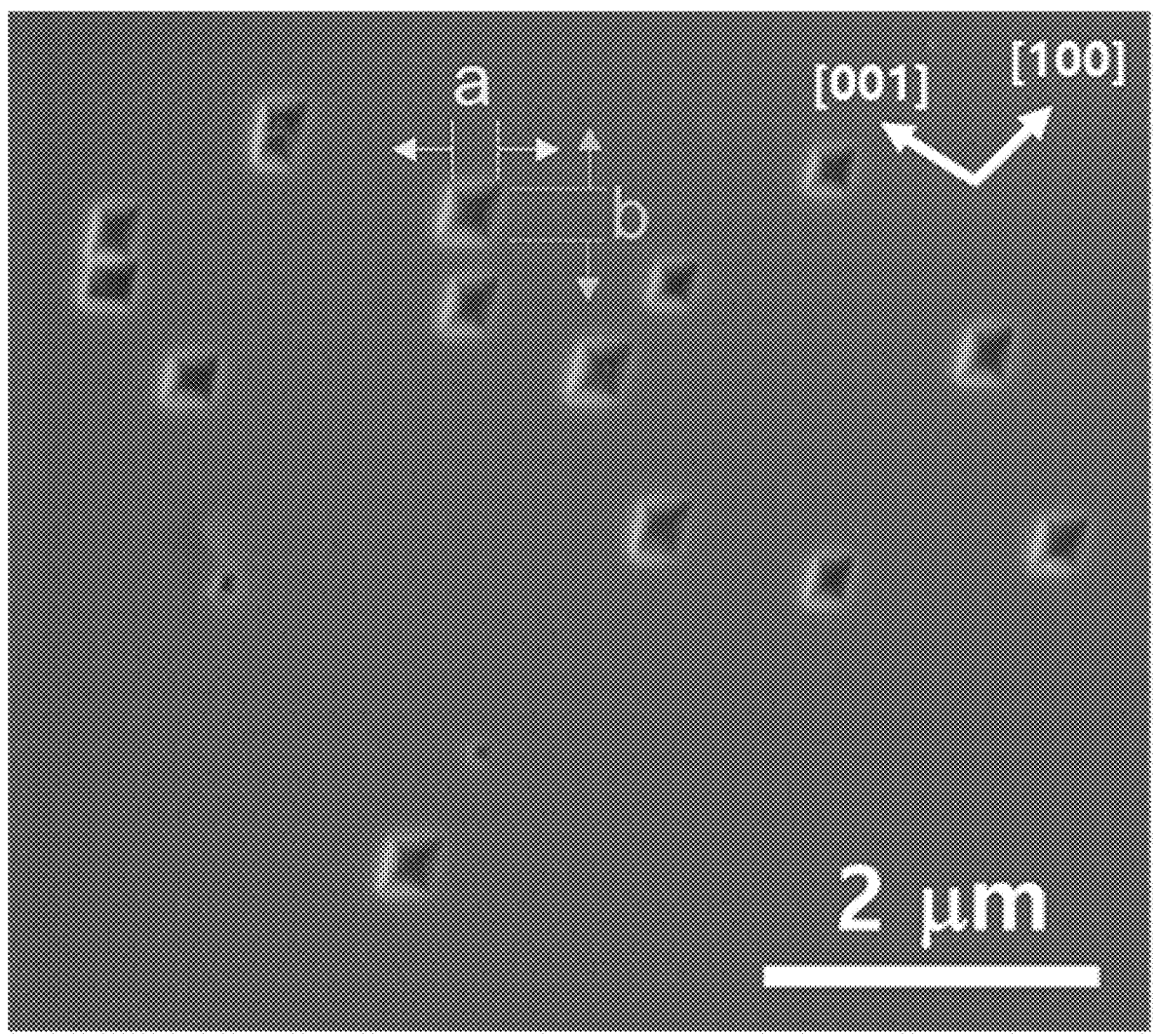
FIG. 8 is a SEM image showing an etch pit formed on a (010) gallium oxide epi-layer.

FIG. 8 is a planar SEM image showing an etch pit of a gallium oxide epi-layer grown on the (010) substrate of Preparation Example 2. The primary etch pit of the epi-layer grown on the substrate (010) was in a parallelogram shape as can be identified in FIG. 8, different from the result that the most etch pits observed in the epi-layer grown on a substrate (001) was in a rod shape. The width (a) in the parallelogram-shaped etch pits and the length (b) in the direction perpendicular to the width (i.e., the height of the parallelogram) were in the range of 100 to 200 nm, respectively.

Figure 9:
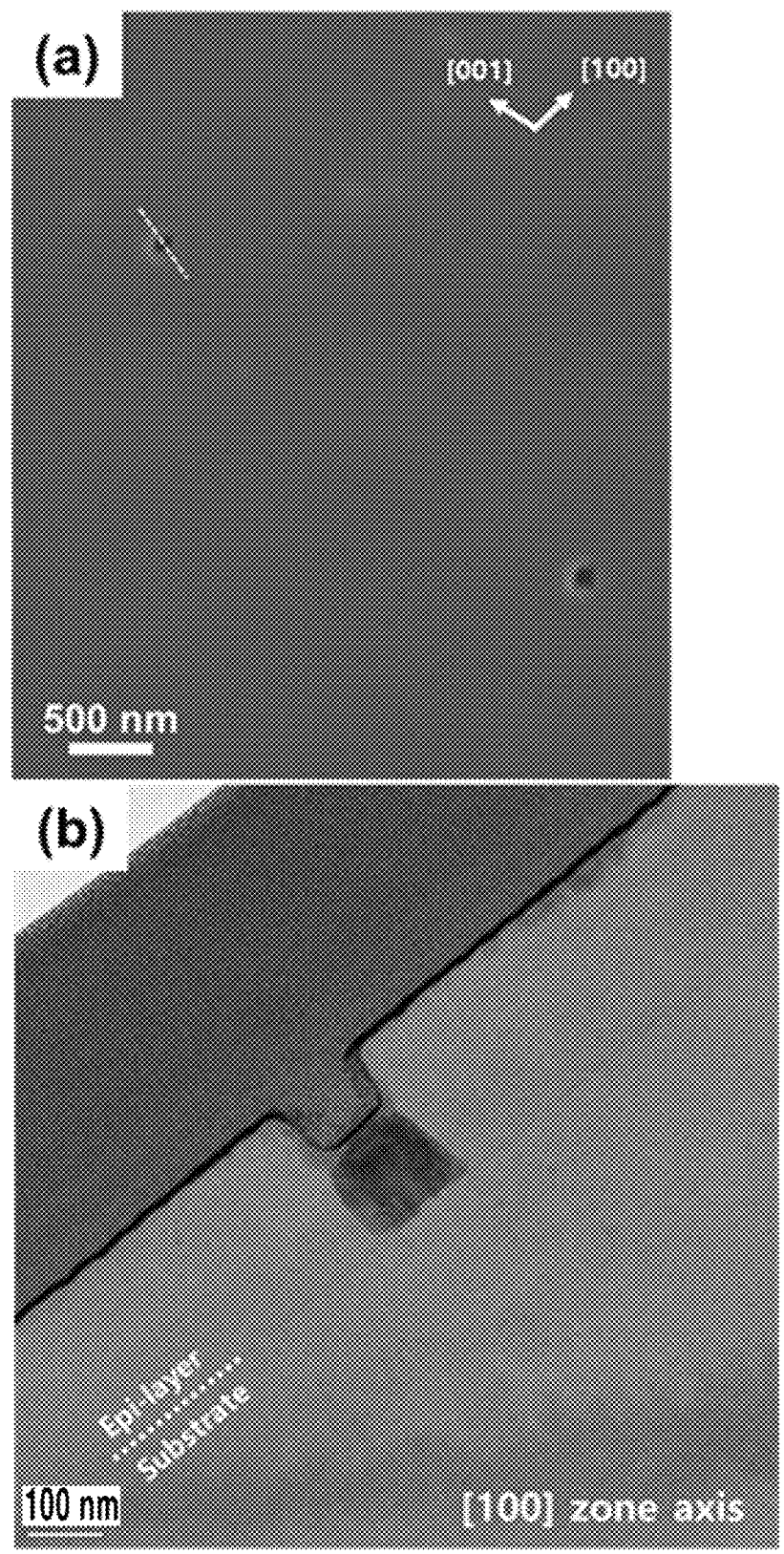
FIG. 9 is a cross-sectional TEM image of an etch pit formed on a (010) gallium oxide epi-layer.

A TEM image of a cross-section including the etch pit was observed to identify the correlation between an etch pit and a defect. FIG. 9(a) is an SEM image of a surface including an etch pit on which a FIB TEM specimen was prepared, and (b) is a low magnification bright-field SEM image of the FIB cross-sectional TEM specimen along a yellow dotted line. In FIG. 9(b), crystal defects are present under the etch pit, and the crystal defects start at the interface of the substrate and the epi-layer and propagate to the surface of the epi-layer to a size almost identical to that at the interface.

Figure 10:
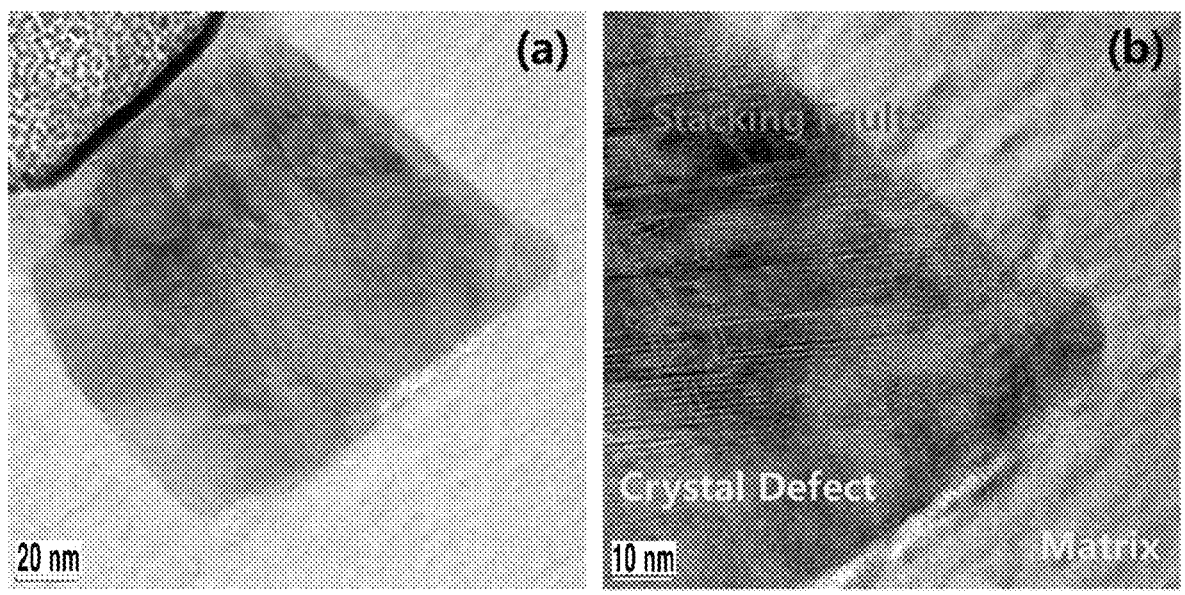
FIG. 10 is a high magnification cross-sectional TEM image for analyzing origin of an etch pit formed on a (010) gallium oxide epi-layer.

FIG. 10 is a high magnification bright-field TEM image of a cross-section specimen for the etch pit, showing that FIG. 10(a) defects are present under the etch pit, and the etch pit width reflects the width of the defect as it is. It is also shown that the defects begin at the interface of the substrate and the epi-layer and propagate to the epi-layer, and there is no significant difference in the width of the defects as the epi-layer is grown, and the width of the defects remains almost constant as that of at the interface. FIG. 10(b) is a further magnified image of FIG. 10(a), and may identify the crystal orientation of the epi-layer and the defect is different from each other and a plurality of stacking faults are included in the crystal.

Figure 11:
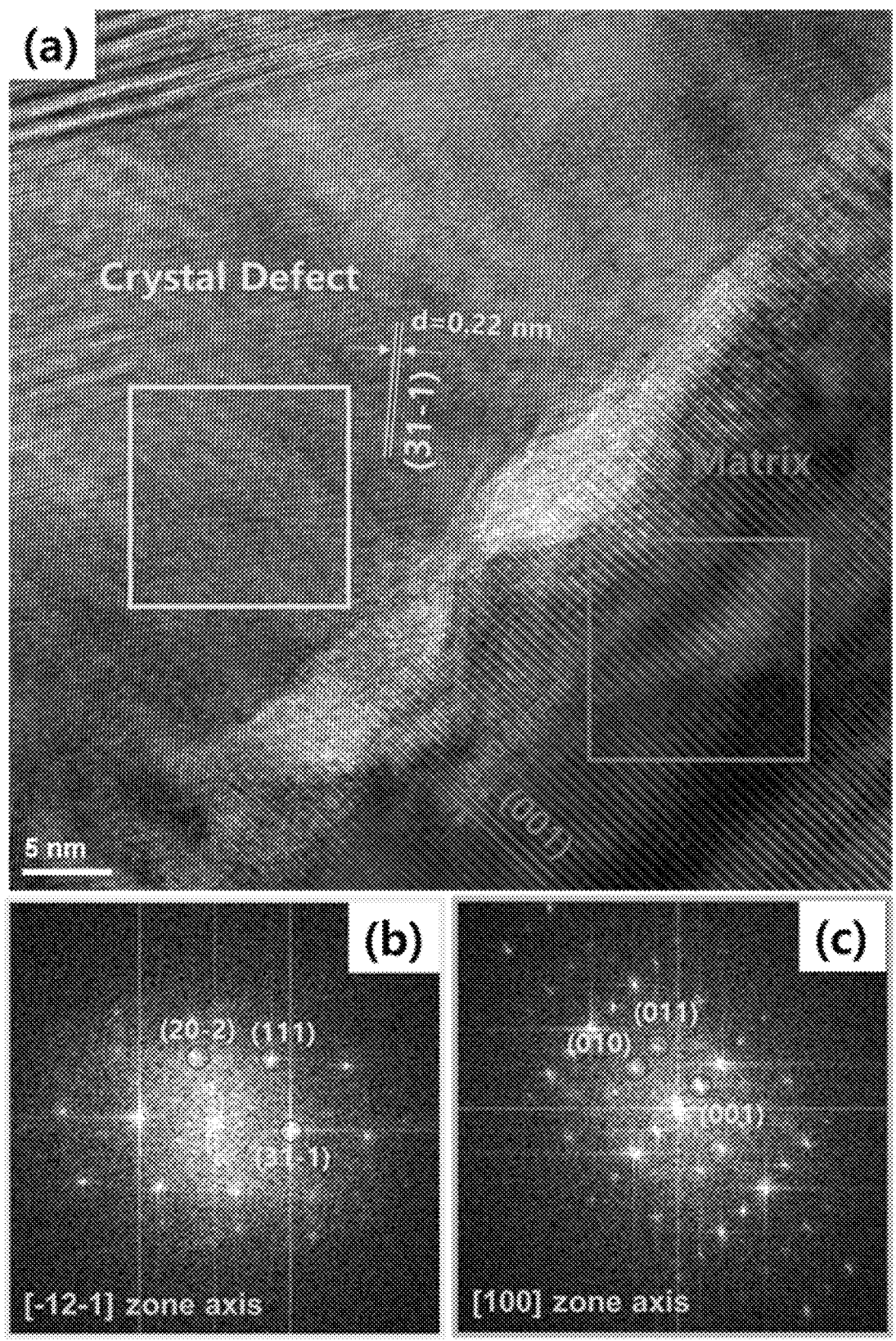
FIG. 11 is a high resolution TEM image and TEM diffraction patterns of a matrix and defect regions of a (010) gallium oxide epi-layer.

In order to clarify the cause of the defect, the defect region is observed with a high-resolution TEM and the results are shown in FIG. 11. FIG. 11(b) and FIG. 11(c) are images showing a TEM diffraction pattern of a defect region and a matrix region represented by yellow and green quadrangles in the TEM image of (a), respectively, and the difference in the crystal orientations of the defect region and the matrix region may be seen clearly. FIG. 11(a) illustrated the crystal plane orientations of the defect region and the matrix region, from which it may be seen that the defect regions have completely different crystal orientations with respect to the normal matrix region and are rotated in a specific direction. As like in Preparation Example 1, the rotation of the crystal orientations results in an incoherent interface in the matrix region and the defect region, which causes additional defects, such as rotational orientation or stacking faults inside the defect region. Thus, in FIG. 11(a) not only the incoherent interface due to the rotation in the crystal direction but also the stacking faults in the crystal defect are observed.

Overall, a parallelogram-shaped etch pit, which is the primary etch pit is mainly caused by growth in which the crystal orientations of the matrix region are rotated. In addition, a significant number of stacking faults were observed in the crystal defects, which was higher in frequency than the defects observed in the volumetric defect of the epi-layer grown in Preparation Example 1.

Accordingly, the primary defect observed in the gallium oxide (010) epi-layer is also predicted that the entire defect region may attribute degradation of a device severely as observed in a (001) epi-layer. Thus, the defect may also be treated with a volumetric defect, and the defect density is to be considered in terms of the volumetric defects.

Figure 12:
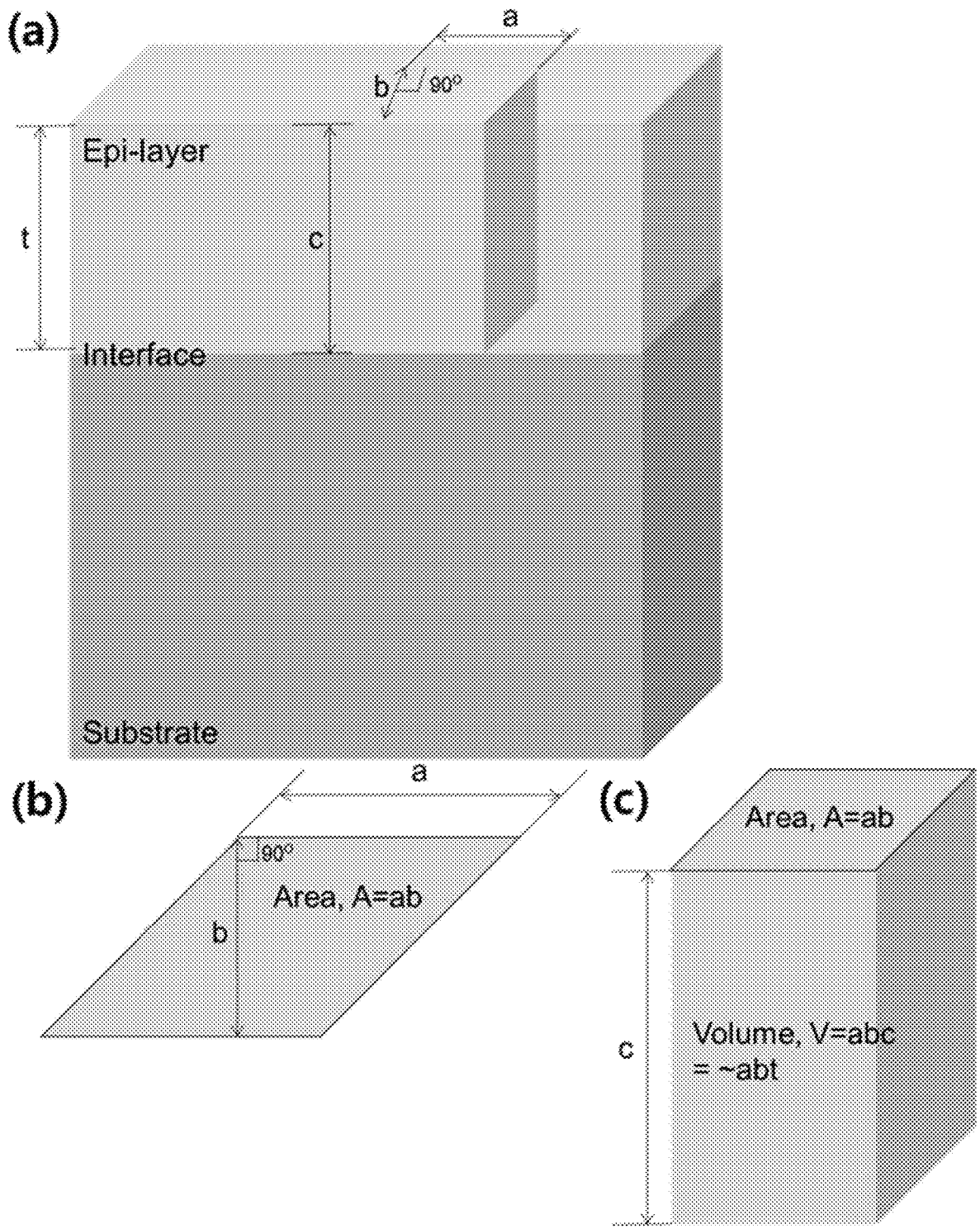
FIG. 12 is a schematic diagram showing an etch pit derived from a volumetric defect in a (010) gallium oxide epi-layer.

Since the volumetric defects observed from the (010) epi-layer are propagated from the interface between a substrate and the epi-layer, the defect density may be calculated more simply than the volumetric defects observed from the (001) epi-layer. FIG. 12 is a schematic diagram to calculate the defect density of the volumetric defect, which is a primary defect observed in the (010) epi-layer. The volumetric defects in the (010) epi-layer can be typified in a form of cuboids with a parallelogram in cross-section. Accordingly, the volume for one of the volumetric defects can be determined from the following equation: abc, wherein a is the width of etch pit, b is the length of etch pit, and c is the depth of the volumetric defect. The length of etch pit is the length in the directions perpendicular to the width of the etch pit, which corresponds to the height of a parallelogram. The volumetric defect propagates from the interface between the substrate and the epi-layer, therefore c is the same as the thickness of the epi-layer.

Therefore, the total volume V, where V=xyz, the density of volumetric defect may be determined from the following equation:

$$\text{Volumetric defect density} = \Sigma a_i b_i z / xyz = \Sigma a_i b_i / xy = \Sigma a_i b_i / \text{area of sample},$$

wherein $a_i$ is the width of the etch pit by the i-th volumetric defect; $b_i$ is the height of the etching pit by i-th volumetric defect.

As described above, according to a method for evaluating a monoclinic gallium oxide sample of the present invention, a volumetric defect density which is a primary defect that is observed from the optical microscope after simply etching the sample may be evaluated qualitatively/quantitatively, and used for the analysis of a monoclinic or monoclinic thin film sample.

Accordingly, the method for evaluating the volumetric defects, for example, a crystal for manufacturing the semiconductor device or for setting an optimized condition that may reduce the volumetric defects, may be used efficiently.

What is claimed is:

1. A quantitative evaluation method of a volumetric defect density due to grains having different crystal orientations to a single crystal matrix in a (001) monoclinic gallium oxide sample or a (010) gallium oxide sample, the method comprising the steps of:
   forming an etch pit by etching an observation plane of a single crystal;
   selecting a quadrilateral etch pit formed by volumetric defects that are not void defects; and
   evaluating a volumetric defect density from a shape of the etch pit due to the volumetric defects by the following equation, volumetric defect density=$\Sigma k a_i b_i$/area of sample,
   wherein $0 < k \leq 1$, ai is the width of the etch pit by the i-th volumetric defect; bi is the height of the etching pit by i-th volumetric defect.

2. The method according to claim 1, wherein additional defects are contained in the grains.

3. The method according to claim 1, wherein a monoclinic gallium oxide sample is a (001) sample, then k is $0 < k \leq \frac{1}{2}$.

4. The method according to claim 3, wherein a thickness of the (001) monoclinic gallium oxide sample is equal to or greater than 1.5 µm, then k=½.

5. The method according to claim 1, wherein a monoclinic gallium oxide sample is a (010) sample, then k=1.

\* \* \* \* \*